(12) United States Patent
Nagai et al.

(10) Patent No.: US 7,106,651 B2
(45) Date of Patent: Sep. 12, 2006

(54) SEMICONDUCTOR MEMORY DEVICE AND METHOD OF READING DATA FROM SEMICONDUCTOR MEMORY DEVICE

(75) Inventors: Kenji Nagai, Kasugai (JP); Satoru Kawamoto, Kasugai (JP)

(73) Assignee: Spansion LLC, Sunnyvale, CA (US)

( * ) Notice: Subject to any disclaimer, the term of this patent is extended or adjusted under 35 U.S.C. 154(b) by 7 days.

(21) Appl. No.: 11/066,484

(22) Filed: Feb. 28, 2005

(65) Prior Publication Data
US 2005/0141328 A1 Jun. 30, 2005

Related U.S. Application Data

(63) Continuation of application No. PCT/JP03/01739, filed on Feb. 18, 2003.

(51) Int. Cl.
*G11C 8/00* (2006.01)
(52) U.S. Cl. ............... 365/230.06; 365/189.04; 365/238.5
(58) Field of Classification Search ........... 365/230.06, 365/230.03, 238.5, 189.01, 189.04, 233
See application file for complete search history.

(56) References Cited

U.S. PATENT DOCUMENTS

| 5,619,473 A | 4/1997 | Hotta |
| 5,748,561 A | 5/1998 | Hotta |
| 6,151,268 A | 11/2000 | Yoshikawa |
| 6,469,951 B1 * | 10/2002 | Toda ............ 365/230.03 |
| 6,556,483 B1 * | 4/2003 | Ryan et al. ............ 365/189.04 |

FOREIGN PATENT DOCUMENTS

| JP | 04-157693 | 5/1992 |
| JP | 06-111565 | 4/1994 |
| JP | 08-063990 | 3/1996 |
| JP | 11-007765 | 1/1999 |
| JP | 11-328950 | 11/1999 |
| JP | 2000-011645 | 1/2000 |

* cited by examiner

*Primary Examiner*—Gene N. Auduong
(74) *Attorney, Agent, or Firm*—Arent Fox PLLC

(57) ABSTRACT

A semiconductor memory device is arranged so that its circuit area is made smaller and the stored data may be constantly outputted at fast speed. The semiconductor memory device includes a memory cell array and an auxiliary cell array concatenated with word lines on the increasing side of bit-line addresses in the memory cell array. The auxiliary cell array stores data of memory cells in the range from a first bit-line address on a next word-line address to a bit-line address located apart by a predetermined number of bits. A Y-address driver is also included in the semiconductor memory device. The Y-address driver reads data from the auxiliary cell array following the last bit-line address if the read of data pieces at a time ranges from the last bit-line address to the first bit-line address on the next word-line address in the memory cell array.

34 Claims, 14 Drawing Sheets

SEMICONDUCTOR MEMORY DEVICE AND METHOD OF READING DATA FROM SEMICONDUCTOR MEMORY DEVICE

This application is a continuing application, filed under 35 U.S.C. §111(a), of International Application PCT/JP2003/001739 filed Feb. 18, 2003.

BACKGROUND OF THE INVENTION (1) Field of the Invention

The present invention relates to a semiconductor memory device and a method of reading data from the semiconductor memory device. In particular, the present invention relates to a semiconductor memory device which is arranged to read and output a plurality of data pieces at a time and the method of reading a plurality of data pieces from the semiconductor memory device and outputting them at a time.

(2) Description of the Related Art

For a memory such as a DRAM or a SRAM, a 2-bit prefetch operation has been proposed as a method of reading data from such a memory. The 2-bit prefetch is executed to read 2-bit data from memory cells at a time and continuously output the data to the outside (which is called a gapless read). However, when a reading operation is shifted from a word-line address being currently processed into the next word-line address, the reading operation needs to take a time in switching one word line to another. This switching time also needs a wait cycle in outputting the data. This thus makes it impossible to realize the gapless read. The partial improvement of the 2-bit prefetch for overcoming this shortcoming leads to a 4-bit prefetch.

FIG. 12 illustrates a schematic view of a memory cell array. FIG. 13 is a timing chart showing an operation of reading data from the memory cell array shown in FIG. 12 through the effect of the 4-bit prefetch.

A circle shown in FIG. 12 indicates a memory cell. WL0, ..., WLj, WLk, ..., WLm (j, l and m are a positive integer) indicate the word-line addresses of the memory cells, respectively. BL0, ..., BLn (n is a positive integer) indicate the bit-line addresses, respectively.

The clock CLK shown in FIG. 13 indicates a synchronous clock. In synchronous to the clock, the memory device is operated. AVD# denotes an initial address read signal which indicates a start signal of reading an external address. An address ADD denotes a series of addresses generated on an external address read from the outside. In an Ax, y of the address ADD, an "x" portion denotes a word-line address of a memory cell and a "y" portion denotes a bit-line address thereof. A data DATA denotes data of a memory cell to be outputted. In a Dx, y of the data DATA, an "x" portion denotes a word-line address of the memory cell in which data is stored and a "y" portion denotes a bit-line address thereof. A word-line signal WL denotes a word line of a memory cell to be selected when data is read out and its timing. WLj and WLk shown in FIG. 13 correspond with the word-line addresses of the memory cells shown in FIG. 12, respectively. A sensing SNS denotes a bit-line address at which data being outputted from a memory cell is sensed and its sensing timing. BLn−3 to BL7 correspond with the bit-line addresses of the memory cells shown in FIG. 12, respectively. In FIG. 13, arrows denote synchronous timings between a clock CLK and a data DATA and between a clock CLK and a sensing SNS.

As shown in FIG. 13, the memory device obtains an external address on the timing of the initial address read signal AVD# and generates the continuous addresses Aj, n−3 to Aj, n as indicated in the address ADD. Then, based on the address Aj, n−3 to Aj, n, the memory outputs a word-line signal WL of the word-line address WLj onto the memory cell and then senses the bit-line address BLn−3 to BLn. As a result, as indicated in the data DATA, the data Dj, n−3 to Dj, n of the memory cells at the bit-line addresses BLn−3 to BLn on the word-line address BLj are outputted to the outside of the memory.

When the address ADD shifts to the address Ak, 0 to Ak, 3, the memory outputs a word-line signal WL of the word-line address WLk to a memory cell and then senses the bit-line addresses BL0 to BL3 as indicated in the sensing SNS. Thus, as indicated in the data DATA, the data Dk, 0 to Dk, 3 of the memory cells at the bit-line addresses BL0 to BL3 on the word-line address WLk are outputted to the outside.

For the 4-bit prefetch, as shown in FIG. 13, the word line may be switched from one to another while the 4-bit data is being outputted. This switching results in efficiently realizing the gapless read. However, in some cases, the 4-bit prefetch may not realize the gapless read. FIG. 14 illustrates the timing on which the gapless read may not be realized. As shown, in a case that the first access to a memory cell starts at a bit-line address BLn−1 located within four bits from the last bit-line address BLn of the word-line address WLj, while the 2-bit data Dj, n−1 to Dj, n are being outputted, it is necessary to switch the word-line address WLj to the other word-line address WLk. Hence, even the 4-bit prefetch needs a wait cycle.

Moreover, as a memory, a semiconductor memory device has been proposed which is arranged to provide two memory cell arrays whose word lines are shifted alternately so that data may be outputted without having to switch an address signal from the outside. The conventional prefetch has a disadvantage that no gapless read may be realized and the data output is made slower accordingly.

In the semiconductor memory disclosed in the Official Gazette of the Japanese Unexamined Patent Publication No. 04-157693, the semiconductor memory is equipped with two memory cell arrays and thus two systems of the relevant wirings and circuits like decoders. This double system results in disadvantageously making the circuit area larger.

SUMMARY OF THE INVENTION

The present invention is made in consideration of these disadvantages. It is an object of the present invention to provide a semiconductor memory device which is arranged to make its circuit area smaller and to constantly output data at fast speed and a method of reading data from the semiconductor memory device which method is arranged to constantly output data at fast speed.

The present invention presents a semiconductor memory device which is arranged to read and output a plurality of data pieces at a time. According to an aspect of the present invention, the semiconductor memory device includes a memory cell array, an auxiliary cell array concatenated with word lines on the increasing side of bit-line addresses of the memory cell array and for storing data at a first bit-line address on the next word-line address of the memory cell array to a bit-line address located apart by a predetermined number of bits, and an address driver for reading data from the auxiliary cell array if the read of a plurality of data pieces at a time ranges from the last bit-line address of the memory cell array to the first bit-line address on the next word-line address thereof or from the first bit-line address on the next word-line address of the memory cell array to the last bit-line address of the previous word-line address.

Further, the present invention presents the method of reading a plurality of data pieces at a time from a semiconductor memory device. According to another aspect of the present invention, the method of reading a plurality of data pieces at a time from the semiconductor memory device includes the step of reading the data pieces from an auxiliary cell array concatenated with word lines on the increasing side of bit-line addresses in a memory cell array and for storing data at a first bit-line address on a next word-line address to a bit-line address located apart by a predetermined number of bits in the memory cell array if the read of the data pieces at a time ranges from a last bit-line address to a first bit-line address on a next word-line address in the memory cell array.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
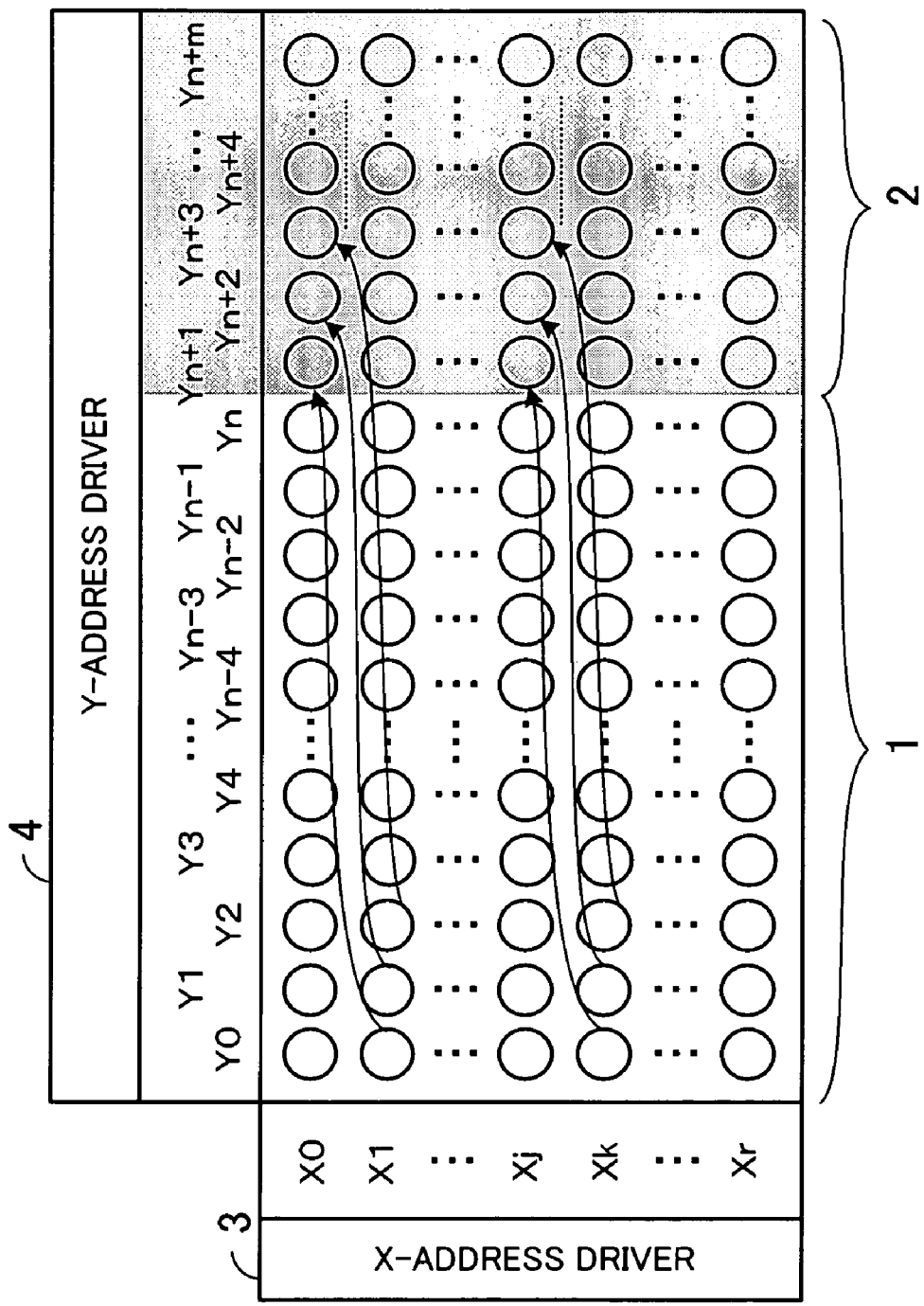
FIG. 1 is a principle view for explaining the principle of a semiconductor memory device according to the present invention.

Hereafter, the embodiments of the present invention will be described with reference to the appended drawings. FIG. 1 illustrates the principle of a semiconductor memory device according to the present invention. As shown, the semiconductor memory device includes a memory cell array 1, an auxiliary cell array 2, an X-address driver 3, and a Y-address driver 4. A circuit shown in FIG. 1 denotes each of memory cells included in the memory cell array 1 and the auxiliary cell array 2. Each memory cell is connected with a word line and a bit line though those lines are not shown. $X0, X1, \ldots, Xj, Xk, \ldots, Xr$ (j, k and r are a positive integer, wherein $k=j+1$) denote word-line addresses of the memory cells, respectively. $Y0, Y1, \ldots, Yn-1, Yn, Yn+1, \ldots, Yn+m$ (n and m are a positive integer) denote bit-line addresses of the memory cells, respectively.

The auxiliary cell array 2 is concatenated with the word lines of the memory cell array 1 on the increasing side of the bit-line address. The bit-line address of the auxiliary cell array 2 follows the last bit-line address Yn of the memory cell array 1. The auxiliary cell array 2 ranges from the bit-line address $Yn+1$ to the bit-line address $Yn+m$.

The auxiliary cell array 2 stores the same data as the data stored in the memory cells ranging from the first bit-line address Y0 on the next word-line address to a bit-line address located apart by a predetermined number of bits. As shown in FIG. 1, in the memory cell of the bit-line address $Yn+1$ on the word-line address Xj stored the data at the bit-line address Y0 on the next word-line address Xk. In the memory cell of the bit-line address $Yn+2$ on the word-line address Xj stored the data at the bit-line address Y1 on the next word-line address Xk. Likewise, in the memory cell of the bit-line address $Yn+m$ on the word-line address Xj stored the data of the bit-line address $Ym-1$ on the next word-line address Xk.

The X-address driver 3 makes the word line active in response to an address signal sent from the outside. The Y-address driver 4 selects two or more bit lines and reads the data pieces outputted from the memory cells at a time in response to an address signal sent from the outside.

In a case that the read of a plurality of data pieces at a time ranges from the last bit-line address Yn of the memory cell array 1 to the first bit-line address Y0 on the next word-line address thereof, the Y-address driver 4 reads data out of the auxiliary cell array 2 following the last bit-line address Yn. For example, when the read of data pieces at a time ranges from the last bit-line address Yn of the memory cell array 1 to the first bit-line address Y0 on the next word-line address Xk thereof, the Y-address driver 4 reads data out of the bit-line address $Yn+1$ of the auxiliary cell array 2 following the last bit-line address Yn on the word-line, address Xj. That is, the Y-address driver 4 enables to continuously read the data from the memory cell array switching the word line of the X-address driver 3.

Hereafter, the operation will be described with reference to the principle view of FIG. 1. The memory cells of each word line included in the auxiliary cell array 2 store the same data as the data stored in the cells at the first bit-line address Y0 on the next word-line address to the bit-line address $Ym-1$ thereon in the memory cell array.

In response to an address signal sent from the outside, the X-address driver 3 makes the word line active and the Y-address driver 4 operates to read a plurality of data pieces outputted from the memory cells at a time.

When the read of data pieces at a time ranges from the last bit-line address Yn of the memory cell array 1 to the first bit-line address Y0 on the next word-line address thereof, the Y-address driver 4 enables to read data from the auxiliary cell array 2 following the last bit-line address Yn. That is, the Y-address driver 4 enables to constantly read the data from the memory cells and thereby to constantly realize the gapless read though the X-address driver 3 does not have to switch the word line.

As described above, the auxiliary cell array 2 is concatenated with the word lines on the increasing side of the bit-line addresses of the memory cell array 1 so that the auxiliary cell array 2 may store the same data as the data stored in the memory cells at the first bit-line address Y0 on the next word-line address to a bit-line address located apart by a predetermined number of bits. Then, in a case that the read of a plurality of data pieces at a time ranges from the last bit-line address Yn of the memory cell array 1 to the first bit-line address Y0 on the next word-line address, the data is read out of the auxiliary cell array 2. This makes it possible to constantly output data from the memory cells at fast speed without switching the word line.

Moreover, the auxiliary cell array 2 is concatenated with the word lines of the memory cell array 1 on the increasing side of the bit-line addresses, so that only one system of wiring and circuits such as a decoder is required and the circuit area is made smaller accordingly.

Figure 2:
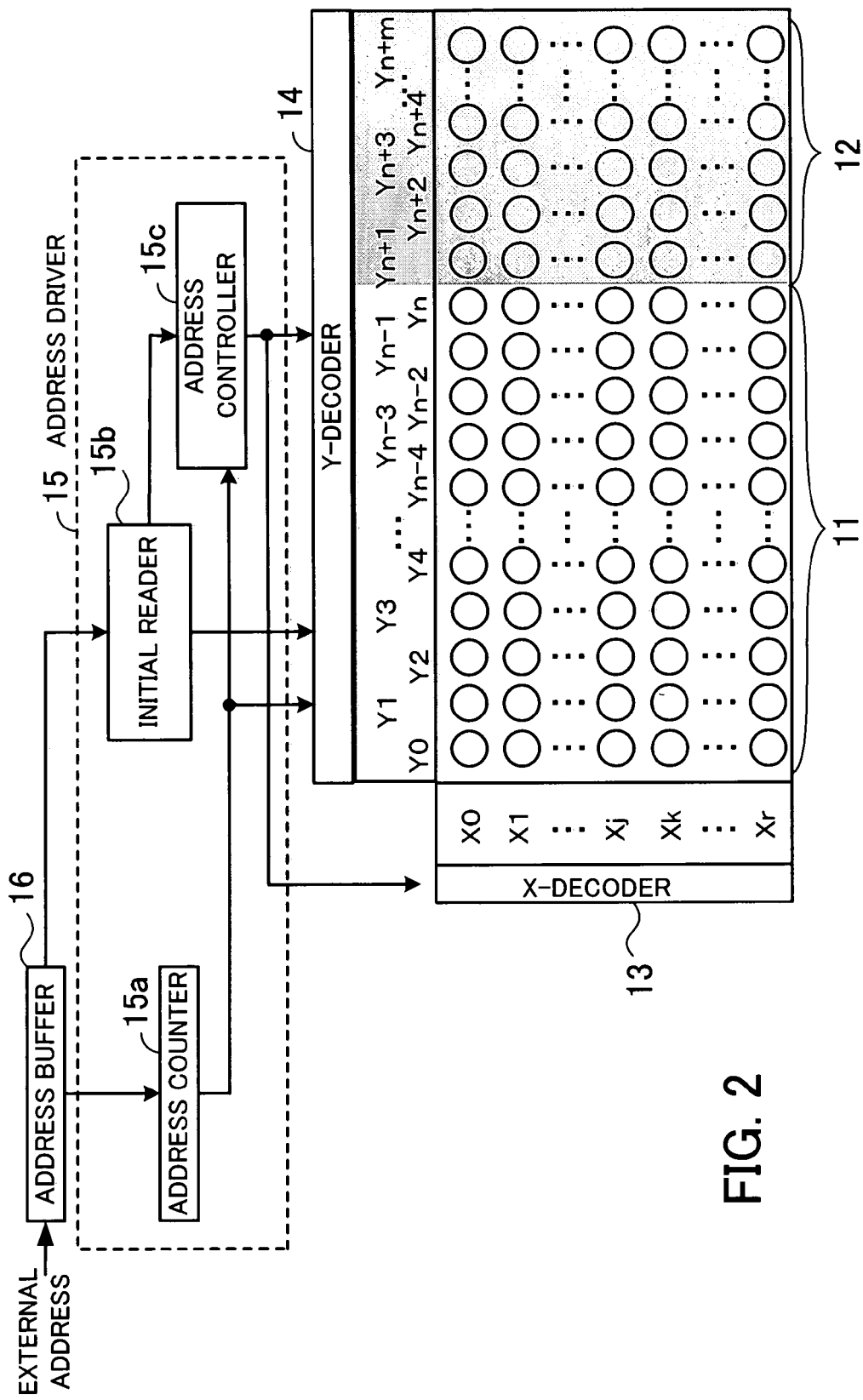
FIG. 2 is a circuit diagram showing a semiconductor memory device according to a first embodiment of the present invention.

In turn, the description will be oriented to the first embodiment of the present invention. FIG. 2 is a circuit diagram showing a semiconductor memory device according to a first embodiment of the present invention. As shown, the semiconductor memory device includes a memory cell array 11, an auxiliary cell array 12, an X-decoder 13, a Y-decoder 14, an address driver 15, and an address buffer 16. The semiconductor memory device is composed of, for example, nonvolatile memories. The semiconductor memory device reads a plurality of data pieces from the auxiliary cell array 12 at a time and thus enables to constantly output data to the outside.

A circle shown in FIG. 2 denotes each of memory cells included in the memory cell array 11 and the auxiliary cell array 12. Each memory cell is connected with a word line and a bit line though those lines are not shown. X0, X1, ..., Xj, Xk, ..., Xr (j, k and r are a positive integer wherein k=j+1) denote word-line addresses of the memory cells, respectively. Y0, Y1, ..., Yn−1, Yn, Yn+1, ..., Yn+m (n and m are a positive integer) denote bit-line addresses of the memory cells, respectively.

The auxiliary cell array 12 is concatenated with the word lines of the memory cell array 11 on the increasing side of the bit-line addresses. The bit-line address of the auxiliary cell array 12 follows the last bit-line address Yn of the memory cell array 11 and ranges from the bit-line address Yn+1 to the bit-line address Yn+m. The number of the memory cells included in the auxiliary cell array 12 is more than or equal to the number of data pieces to be read at a time about each word line. For example, when the 4-bit prefetch is executed, it is necessary to provide four or more memory cells for each word line in the auxiliary cell array 12.

The auxiliary cell array 12 stores the same data as the data stored in the memory cells at the first bit-line address Y0 on the next word-line address to a bit-line address located apart by a predetermined number of bits. As shown in FIG. 2, the memory cell at the bit-line address Yn+1 on the word-line address Xj stores the data at the bit-line address Y0 on the next word-line address Xk. The memory cell at the bit-line address Yn+2 on the word-line address Xj stores the data at the bit-line address Y1 on the next word-line address Xk. Likewise, the memory cell at the bit-line address Yn+m on the word-line address Xj stores the data at the bit-line address Ym−1 on the next word-line address Xk.

The auxiliary cell array 12 stores data from the memory cells at the first bit-line address Y0 on the next word-line address to a bit-line address located apart by at least the number corresponding to the number of data pieces to be read at a time. For example, when the 4-bit prefetch is executed, the memory cells included in the auxiliary cell array 12 store the data at the first bit-line address Y0 on the next word-line address to the bit-line address Y3 being advanced by at least four addresses.

The X-decoder 13 causes the word line at the word-line address indicated by the address driver 15 to be active. The Y-decoder 14 obtains the data at the bit-line address indicated by the address driver 15 and then outputs the data to the outside.

The address buffer 16 holds an external address specified from the outside. Further, if the external address is changed, the address buffer 16 also holds the changed address. Instead, the address buffer 16 holds the external address being inputted in synchronous to a read/write signal sent from the outside.

The address driver 15 is composed of an address counter 15a, an initial reader 15b and an address controller 15c.

The address counter 15a generates a series of internal addresses (including addresses at which access is made to the memory cell, that is, a bit-line address and a word-line address) on the basis of the external address held in the address buffer 16. That is, the address counter 15a assumes the external address specified from the outside as an initial address and generates a series of internal addresses with this initial address as a start point. The generated internal addresses are outputted to the Y-decoder 14 and the address controller 15c.

The initial reader 15b determines whether or not the initial address (external address) served as the start point of reading data from a memory cell stays in the range of the last bit-line address Yn to the bit-line address located apart by the smaller number than or equal number to the number of data pieces to be read at a time. For example, when the 4-bit prefetch is executed, the initial reader 15b determines whether or not the initial address stays in the range of the word-line addresses Yn to Yn−3. When the initial reader 15b determines that the initial address served as a start point of reading data stays in the range of the last bit-line address Yn to the bit-line address located apart by the smaller number than or equal number to the number of data pieces to be read at a time, the initial reader 15b outputs the determined result to the address controller 15c. On the other hand, when the initial reader 15b determines that the initial address does not stay in the range of the last bit-line address Yn to the bit-line address located apart by the smaller number than or equal number to the number of data pieces to be read at a time, the initial reader 15b outputs the determined result to the Y-decoder 14.

Figure 3:
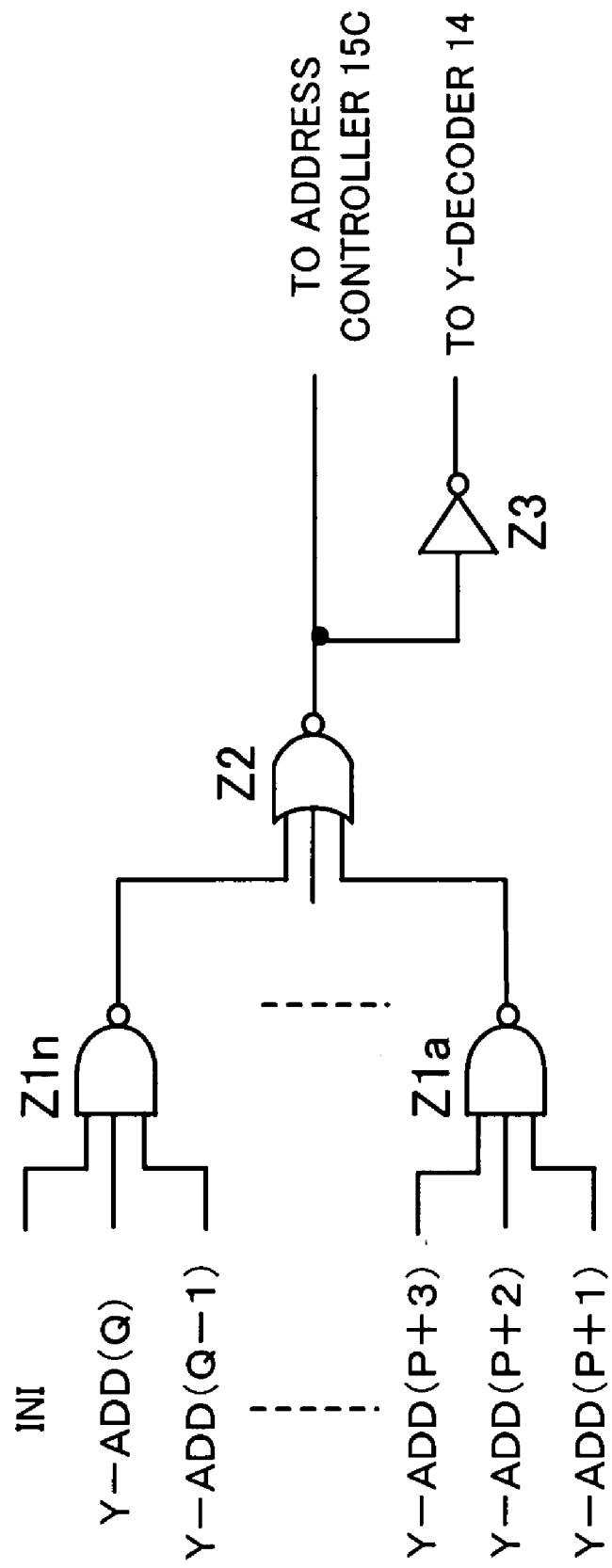
FIG. 3 is a circuit view showing a concrete arrangement of an initial read circuit included in the semiconductor memory device.

FIG. 3 illustrates the concrete circuit of the initial reader 15b. As shown, the initial reader 15b is composed of NAND circuits Z1a to Z1n, a NOR circuit Z2 and an inverter circuit Z3. In the initial reader 15b, when the inputs of the NAND circuits Z1a to Z1n are at H (high) level, the NOR circuit Z2 is caused to output a H signal. An address line Y-ADD denotes an address line of an external address to be used for selecting a bit line of the memory cell array 11. Of the external address lines Y-ADD of 0 to Q bits, the external address line Y-ADD (P+1) at the (P+1)th location to the external address line Y-ADD (Q) at the Qth location are inputted into the NAND circuits Z1a to Z1n. Hence, when the external address line Y-ADD (P+1) to the external address line Y-ADD (Q) are all at H level, the NOR circuit Z2 is caused to output the H signal. In addition, the initial signal INI is a synchronous signal on which the external address is read (to be discussed below).

That is, the external address line Y-ADD (0) to the external address line Y-ADD (P) represent the last bit-line address Yn of the memory cell array 11 to the bit-line address located apart by the smaller number than or equal number to the number of data pieces to be read at a time, respectively. Based on whether or not the states of the remaining external address line Y-ADD (P+1) to external address line Y-ADD (Q) are all in the predetermined state (H state in the circuit of FIG. 3), it may be determined that the initial address served as the start point of reading data stays in the bit-line address located apart by the smaller number than or equal number to the number of data pieces to be read at a time.

For example, it is assumed that the 4-bit prefetch is executed in the memory cell array 11 and the number of the address lines Y-ADD is 10. Since the number of the address lines Y-ADD is 10, the number of the bit lines included in the memory cell array 11 is 1024. In this case, the eight address lines of Y-ADD (2) to Y-ADD (9) are inputted into the NAND circuits Z1a to Z1n. The bit-line addresses Y1020 to Y1023 (assuming that the bit-line address starts from 0) are represented by the address lines Y-ADD (0) to Y-ADD (1), respectively. Hence, when the address lines Y-ADD2 to Y-ADD9 are all in the predetermined state (H state in the circuit of FIG. 3), it is determined that the initial address served as a start point of reading data stays in the range of the bit-line addresses 1020 to 1023.

Turning to the description of FIG. 2, the address controller 15c causes the Y-decoder 14 to obtain the data of the bit line included in the auxiliary cell array 12 if the initial reader 15b determines that the start point of reading data stays in the range of the last bit-line address Yn to the bit-line address located apart by the smaller number than or equal number to the number of data pieces to be read at a time.

Hereafter, assuming that the semiconductor memory device shown in FIG. 2 executes the 4-bit prefetch, the operation of the memory device will be described below.

Figure 4:
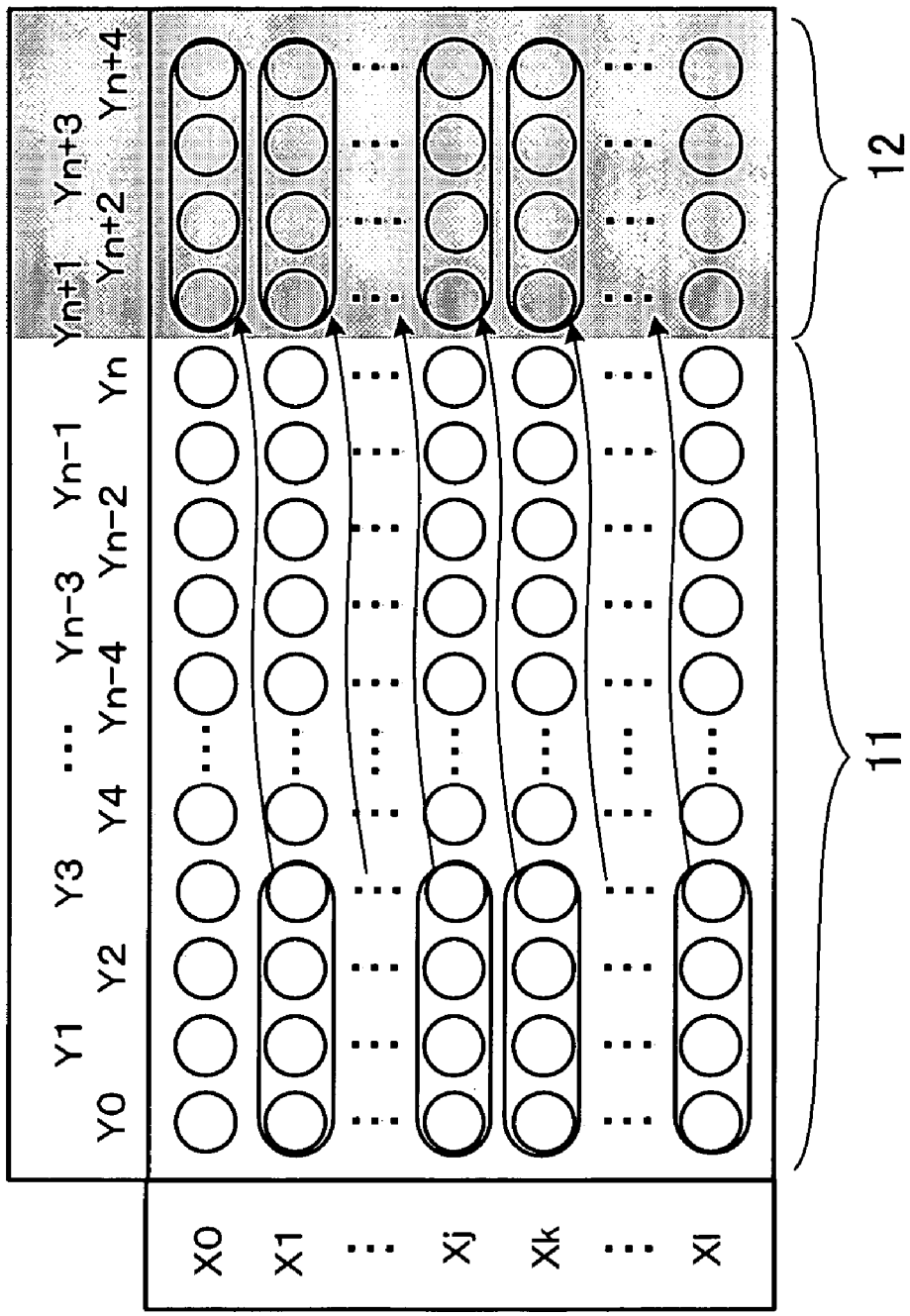
FIG. 4 illustrates a memory cell array in which a 4-bit prefetch is executed.

At first, the description will be oriented to the memory cell array 11. For the 4-bit prefetch, as the auxiliary cell array 12, the memory cells of four bits or more are provided on each word line. Then, the auxiliary cell array 12 stores the same data as the data of the memory cells of at least four bits counted from the first bit-line address Y0 of the memory cell array 11. FIG. 4 shows the memory cell array formed on the assumption that the 4-bit prefetch is executed. As shown in FIG. 2, the auxiliary cell array 12 includes memory cells of four bits following the last bit-line address Yn on each word line included in the memory cell array 11. As indicated by arrows, the memory cells on each word line of the auxiliary cell array 12 stores the data at the bit-line addresses Y0 to Y3 on the next word-line address.

Figure 5:
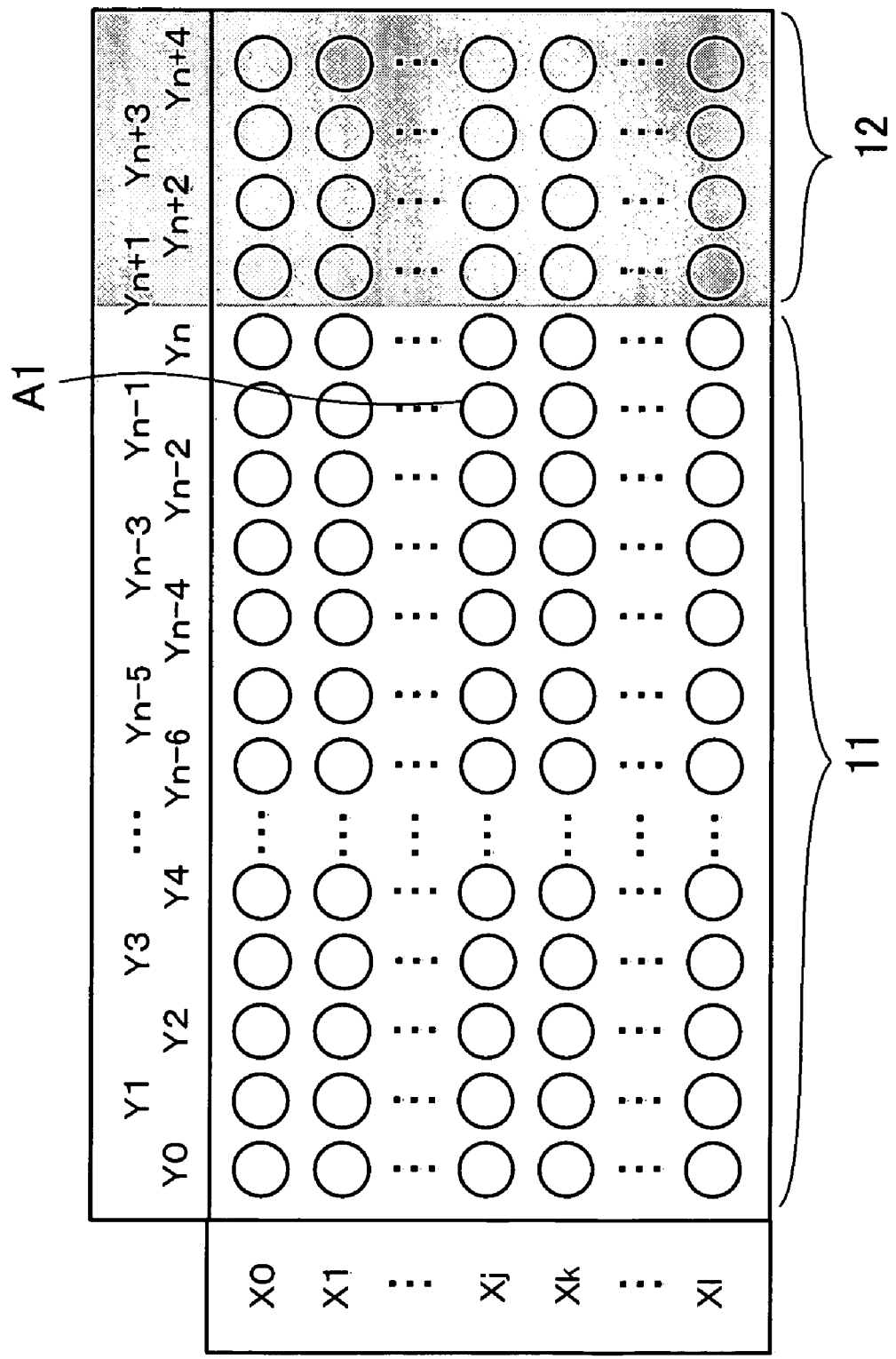
FIG. 5 illustrates a reading start point of the memory cell array.

In turn, the description will be oriented to the operation of reading data. At first, the description will be expanded in the case that the reading start point (that is, an initial address served as a start point of reading data) is in the range of the last bit-line address Yn to the bit-line address located apart by the smaller number than or equal number to the number of data pieces to be prefetched. FIG. 5 shows the reading start point of the memory cell array. A start point A1 shown in FIG. 5 denotes a memory cell from which the reading operation is started. The word-line address on the start point A1 is a word-line address Xj, while the bit-line address on the start point A1 is a bit-line address Yn−1.

Figure 6:
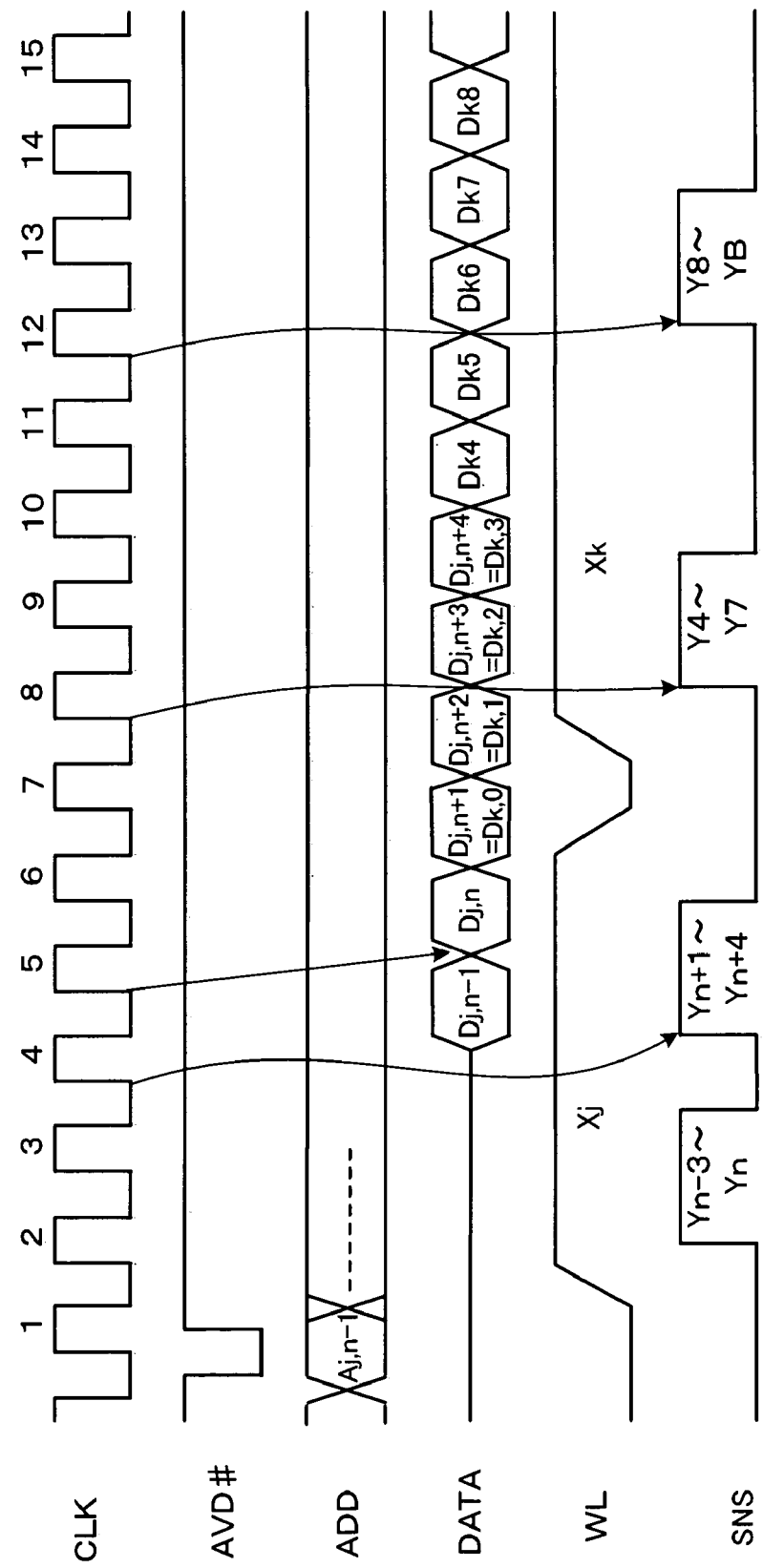
FIG. 6 is a timing chart showing the timing on which the read is executed from the reading start point shown in FIG. 5.

FIG. 6 is a timing chart for illustrating the timings appearing when the read is executed at the start point shown in FIG. 5. A clock CLK shown in FIG. 6 indicates a synchronous clock. The semiconductor memory device is operated in synchronous to the synchronous clock. An initial address read signal AVD# denotes a start signal for reading an external address. An address ADD denotes a series of internal addresses generated on the external address read from the outside. An "x" portion of Ax, y denotes a word-line address of a memory cell shown in FIG. 5 and a "y" portion thereof denotes a bit-line address thereof. A data DATA denotes data of a memory cell to be outputted to the outside. An "x" portion of Dx, y denotes a word-line address of the memory cell storing the data and a "y" portion thereof denotes a bit-line address thereof. A word-line signal WL denotes a word line of a memory cell to be selected and its timing. Xj and Xk shown in FIG. 6 correspond with the word-line addresses of the memory cells shown in FIG. 5, respectively. A sensing SNS denotes a bit-line address at which the data to be outputted from the memory cell is prefetched and its timing. Yn−3 to YB (represented in hexadecimal notation) correspond with the bit-line addresses of the memory cells shown in FIG. 5, respectively. Lastly, an arrow indicates a synchronous timing between the clock CLK and the data DATA or between the clock CLK and the sensing SNS.

At first, the input of the initial address read signal AVD# causes an external address to be held in the address buffer 16 shown in FIG. 2. The address counter 15a generates a series of internal addresses Aj, n−1, . . . as shown in FIG. 6.

Then, the initial reader 15b determines whether or not the reading start point is in the range of the last bit-line address Yn of the memory cell array 11 to the bit-line address located apart by four or less addresses, that is, Yn to Yn−3. In this embodiment, the initial reader 15b determines that the reading start point is between the last bit-line address Yn and the bit-line address Yn−3 located apart by four or less addresses.

The X-decoder 13 causes the word line of the word-line address Xj to be active as indicated in the word-line signal WL of FIG. 6. The Y-decoder 14 prefetches the 4-bit data (located within the predetermined 4-bit addresses) in the range of the bit-line addresses Yn−3 to Yn. The data at the bit-line addresses Yn−3 and Yn−2 are not required by the external address. Hence, as indicated in the data DATA of FIG. 6, the outputted data are 2-bit data Dj, n−1 and Dj, n at the bit-line addresses Yn−1 and Yn on the word-line address Xj.

In succession, as indicated in the sensing SNS of FIG. 6, the Y-decoder 14 prefetches the 4-bit data at the bit-line addresses Yn+1 to Yn+4. That is, the Y-decoder 14 prefetches the data stored in the auxiliary cell array 12. As indicated in the data DATA of FIG. 6, the outputted data are the data Dj, n+1 to Dj, n+4 at the bit-line addresses Yn+1 to Yn+4 on the word-line addresses Xj. It means that the data Dk, 0 to Dk, 3 at the bit-line addresses Y0 to Y3 on the word-line address Xk are outputted to the outside without switching the word line.

The prefetch described about the prior art needs to switch the word line while 2-bit data is being outputted. Since the switching time is longer than the output time of 2-bit data, it is necessary to locate a wait cycle in the data output. According to the present invention, on the other hand, since the data is read out of the auxiliary cell array 12, the continuous output of the data is made possible without inserting the wait cycle.

Figure 7:
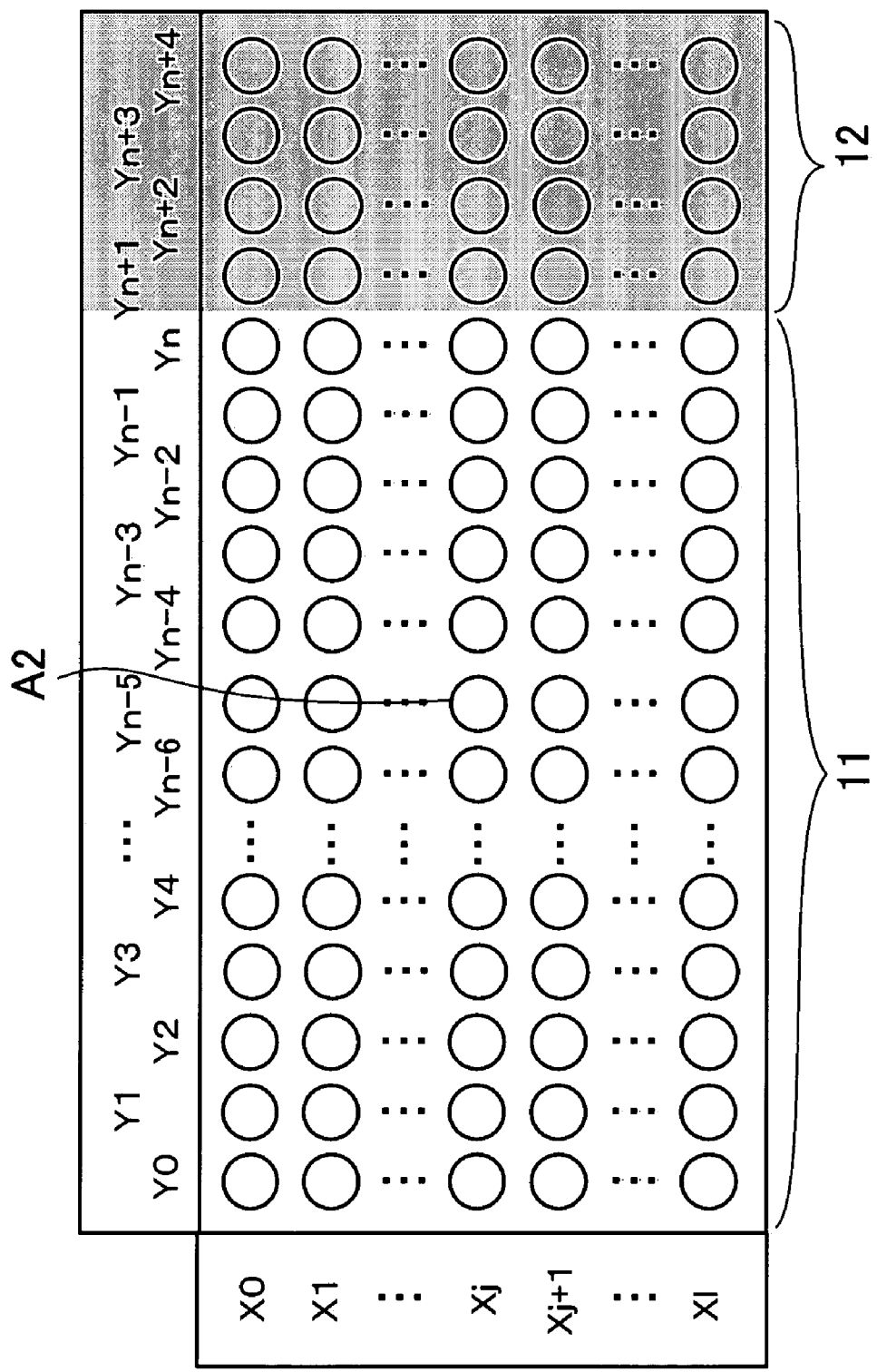
FIG. 7 illustrates a reading start point of the memory cell array.

In turn, the description will be oriented to the reading operation in the case that the reading start point is not in the range of the last bit-line address Yn to the bit-line address located apart by the smaller number than or equal number to the number of data pieces to be prefetched. FIG. 7 shows the reading start point of the memory cell array. A start point A2 shown in FIG. 7 indicates a memory cell from which the read is started. A word-line address at the start point A2 is a word-line address Xj, while a bit-line address at the start point A2 is a bit-line address Yn−5.

Figure 8:
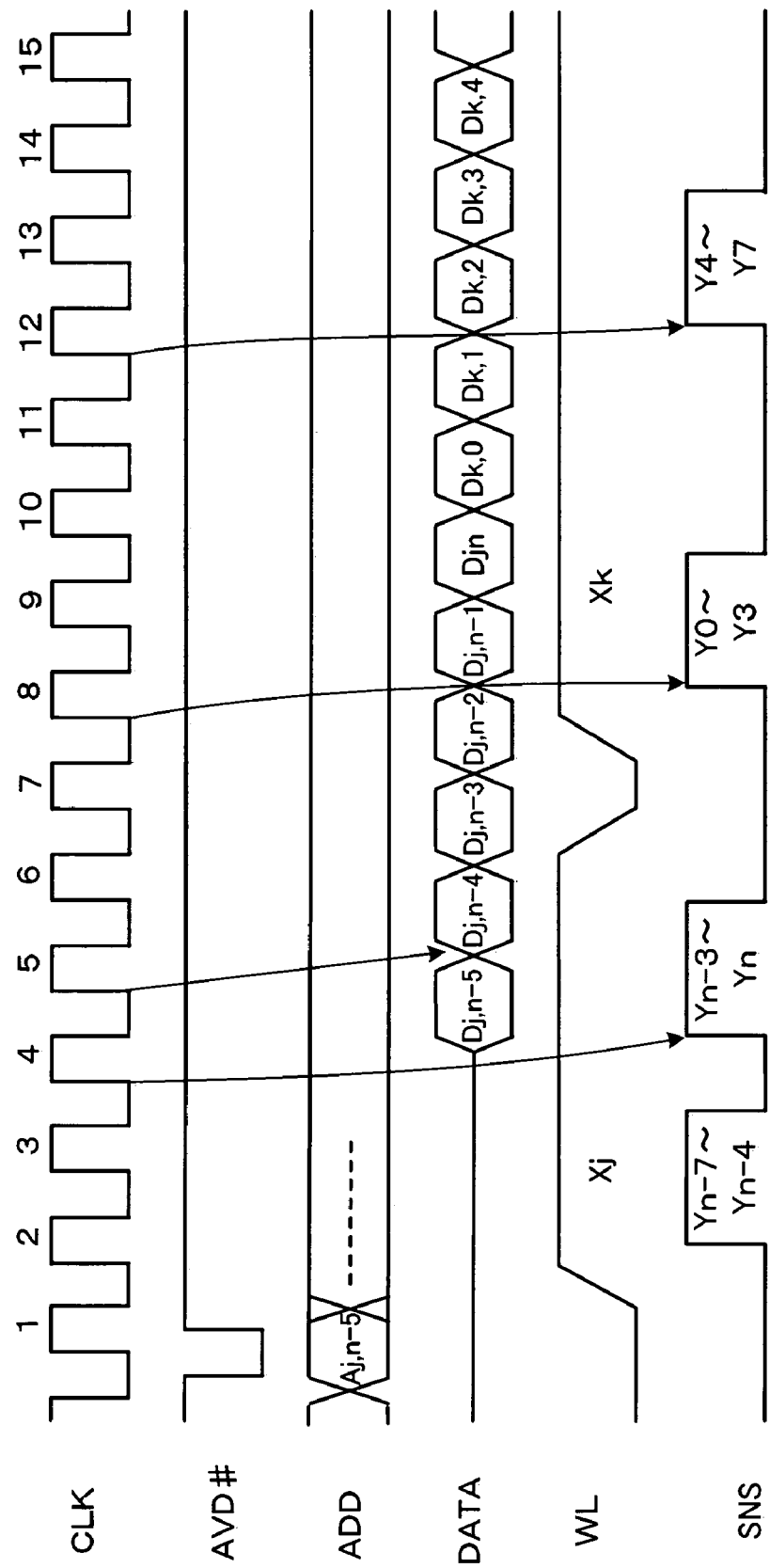
FIG. 8 is a timing chart showing the timing on which the read is executed from the reading start point shown in FIG. 7.

FIG. 8 illustrates the timings appearing when the read is started from the start point shown in FIG. 7. A clock CLK, an initial address read signal AVD#, a address ADD, a data DATA, a word-line signal WL and the sensing SNS shown in FIG. 8 are the same as those shown in FIG. 6. The description about them is left out herein.

At first, the input of the initial address read signal AVD# causes an external address to be held in the address buffer 16. The address counter 15a generates a series of internal addresses Aj, n−5, . . . . as shown in FIG. 8.

The initial reader 15b determines whether or not the reading start point is in the range from the last bit-line address Yn of the memory cell array 11 to the bit-line address Yn−3 located apart by four or less addresses. In this embodiment, the initial reader 15b determines that the reading start point is not in the range from the last bit-line address Yn to the bit-line address Yn−3 located apart by four or less addresses.

The X-decoder 13 selects a word line at the word-line address Xj as indicated in the word-line signal WL of FIG. 8. The Y-decoder 14 prefetches 4-bit data at the bit-line addresses Yn−7 to Yn−4 as indicated in the sensing SNS of FIG. 8. Since the data at the bit-line addresses Yn−7 and Yn−6 are not required by the external address, as indicated in the data DATA of FIG. 8, the outputted data are the data Dj, n−5 and Dj, n−4 at the bit-line addresses Yn−5 and Yn−4 on the word-line address Xj.

In succession, as indicated in the sensing SNS of FIG. 8, the Y-decoder 14 prefetches 4-bit data at the bit-line addresses Yn−3 to Yn. As indicated in the data DATA of FIG. 8, the outputted data are the data Dj, n−3 to Dj, n at the bit-line addresses Yn−3 to Yn on the word-line address Xj.

The X-decoder 13 switches the word line at the address Xj to the word line at the address Xk while 4-bit data of Dj, n−3 to Dj, n are being outputted. Then, the Y-decoder 14 prefetches 4-bit data at the bit-line addresses Y0 to Y3 as indicated in the sensing SNS of FIG. 8. That is, in a case that the reading start point is not in the range from the last bit-line address Yn to the bit-line address located apart by the smaller number than or equal number to the number of data pieces to be prefetched, the switching time of the word line is secured. Hence, it is not necessary to read data out of the auxiliary cell array 12.

As described above, in a case that the initial address served as the data reading start point is in the range from the last bit-line address Yn of the memory cell array 11 to the bit-line address located apart by the smaller number than or equal number to the number of data pieces to be read at a time, the read of the data from the auxiliary cell array 12 makes it possible to realize the continuous output of data.

Further, the auxiliary cell array 12 is concatenated with the word lines on the increasing side of the bit-line addresses in the memory cell array 11. Two systems of the relevant wirings and circuits such as decoders are not required for the auxiliary cell array 12, which leads to making the circuit area smaller.

In a case that the prefetch of the address driver 15 ranges from the first bit-line address Y0 on the word-line address Xk of the memory cell array 11 to the last bit-line address Yn of the previous word-line address Xj thereof, the data is read out of the auxiliary cell array 12. Concretely, in a case that the first bit-line address of the data pieces to be read at a time ranges from the first bit-line address Y0 of the memory cell array 11 to the bit-line address located apart by the smaller number than or equal number to the number of data pieces to be read at a time, the data is read out of the auxiliary cell array 12 at the previous word-line address Xj to the concerned word-line address Xk. Then, the succeeding data is read out of the memory cell array 11. That is, in the case of reading data with decrease of the bit-line addresses, the data may be read out of the memory cells without switching the word line, which makes it possible to constantly output the data at fast speed.

Further, the rise of the clock CLK appearing when the initial address read signal AVD# is in the low state is inputted as an initial signal INI shown in FIG. 3 into the NAND circuit Z1n. That is, the initial reader 15b enables to grasp a newly inputted external address from the initial signal INI.

In turn, the description will be oriented to the second embodiment of the present invention. The second embodiment is different from the first embodiment in the respect that the Y-decoder 14 performs a burst read and the initial reader 15b determines the start point of the initial address on the number of burst reads and that the memory cell array 11 and the auxiliary cell array 12 have another way of storing data. Hereafter, about the second embodiment, only the memory cell array will be described on the condition that the memory cell array is equipped with the X-decoder 13, the address counter 15a, the address controller 15c, the address buffer 16, all of which are shown in FIG. 2, and the just aforementioned Y-decoder 14 and initial reader 15b.

Figure 9:
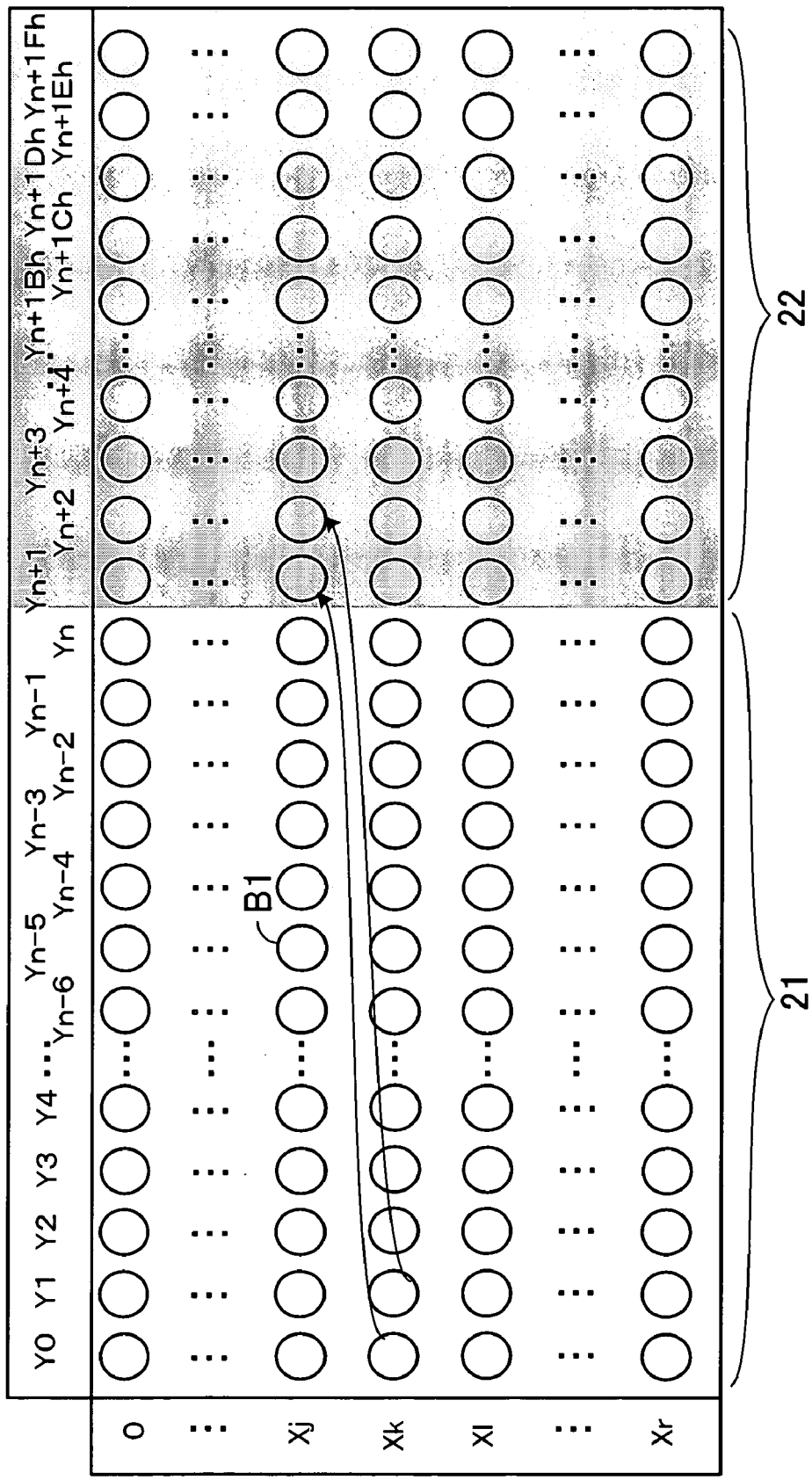
FIG. 9 is a view showing a memory cell array according to a second embodiment of the present invention.

FIG. 9 illustrates an arrangement of the memory cell array according to the second embodiment of the present invention. A circle shown in FIG. 9 denotes each of memory cells included in the memory cell array 21 and the auxiliary cell array 22. Each memory cell is connected with the word line and the bit line though those lines are not shown. X0, X1, . . . , Xj, Xk, X1, . . . . , Xr (j, k, l and r is a positive integer wherein k=j +1 and l=k +1) denote word-line addresses of the memory cells, respectively. Y0, Y1, . . . , Yn−1, Yn, Yn+1, . . . , Yn+1Fh (n is a positive integer) denote bit-line addresses of the memory cell, respectively. In addition, "h" means the Figure is hexadecimal.

The auxiliary cell array 22 is concatenated with the word lines on the increasing side of the bit-line addresses of the memory cell array 21. The bit-line address of the auxiliary cell array 22 follows the last bit-line address Yn of the memory cell array 21 and ranges from the bit-line addresses Yn+1 to Yn+1Fh.

The number of memory cells included in the auxiliary cell array 22 is greater than or equal to the number derived by subtracting 1 from an address length (burst length) to be burst-read. In a case that the burst length may be selected as 8, 16 or 32 bits, more memory cells than the number derived by subtracting 1 from the maximum bit number (32) is provided in each word line.

The auxiliary cell array 22 stores the data at the first bit-line address Y0 to the bit-line address located apart by the number derived by subtracting 1 from the burst length or more, those bit-line addresses located on the next word-line address. In a case that the burst length may be selected as 8, 16 or 32 bits, the auxiliary cell array 22 stores the data at the first bit-line address to the bit-line address located apart by the number derived by subtracting 1 from the maximum bit number.

Hereafter, the description will be oriented to the operation of the 8-bit burst read with the memory cell at the start point B1 as a reading start point in the memory cell array shown in FIG. 9.

Figure 10:
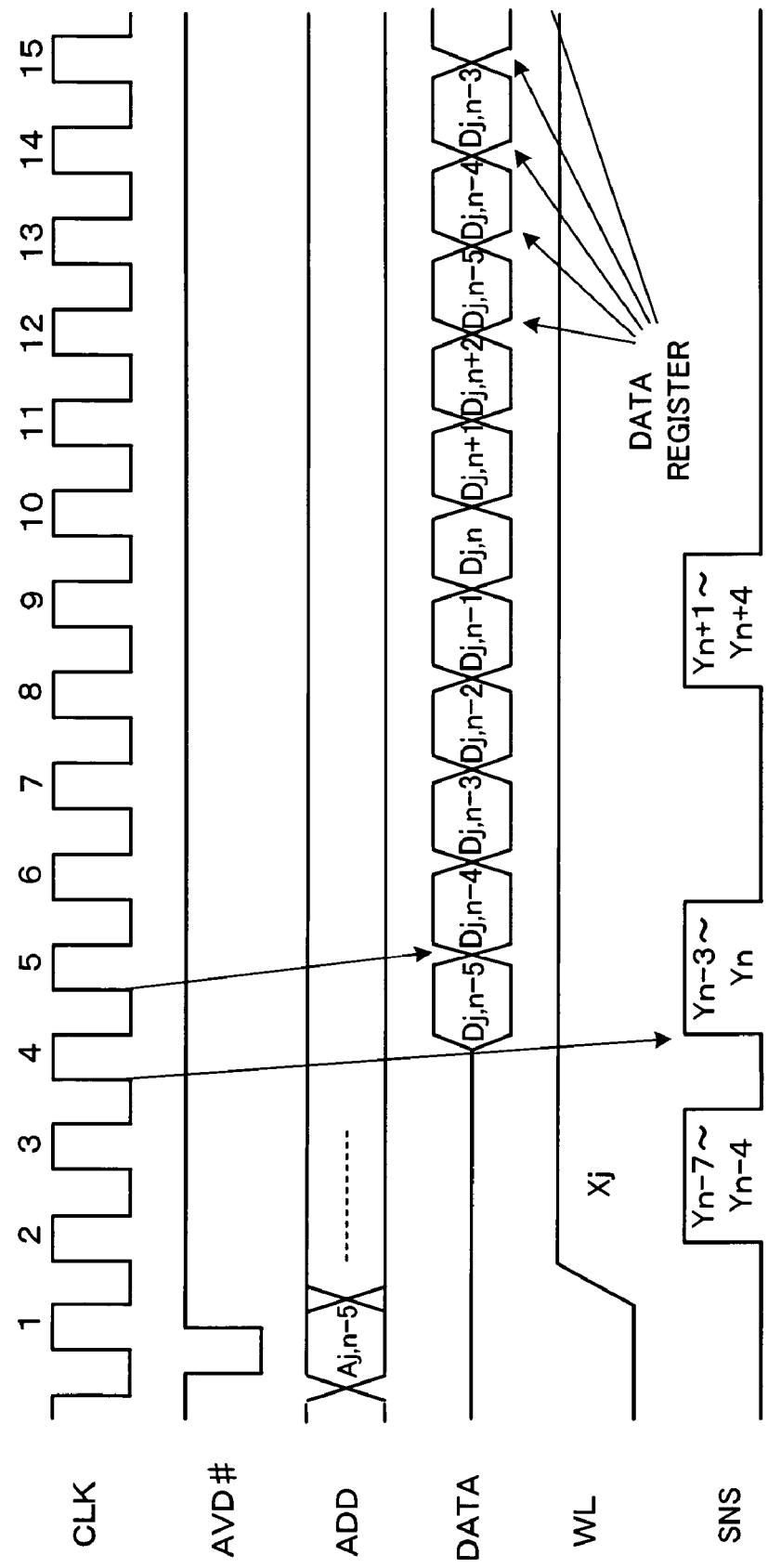
FIG. 10 is a timing chart showing the timing on which a burst read is executed from the reading start point shown in FIG. 9.

FIG. 10 illustrates the timings appearing when the burst read is executed at the start point shown in FIG. 9. A clock CLK, an initial address read signal AVD#, an address ADD, a data DATA, a word-line signal WL, and a sensing SNS shown in FIG. 10 are the same as those shown in FIG. 6. The description about those components is left out herein.

At first, the input of the initial address read signal AVD# causes an external address to be held in the address buffer 16. The address counter 15a generates a series of internal addresses Aj, n–5, . . . as indicated in the address ADD of FIG. 10.

The initial reader 15b determines whether or not the initial address served as a reading start point is in the range of the last bit-line address Yn to the bit-line address Yn–6 located apart by the number of seven bits derived by subtracting 1 from 8 bits to be burst-read or less (less than the number of data pieces to be read at a time, that is, less than 8 addresses), concretely, Yn to Yn–6. In this embodiment, the initial reader 15b determines that the initial address is in the range of the last bit-line address to the bit-line address located apart by 7 addresses or less, that is, Yn to Yn–6.

The X-decoder 13 selects a word line at the word-line address Xj as indicated in the word-line signal WL of FIG. 10. The Y-decoder 14 performs an 8-bit burst read through the effect of the 4-bit prefetch. As indicated in the sensing SNS of FIG. 10, the Y-decoder 14 prefetches 4-bit data at the bit-line addresses Yn–7 to Yn–4 (located within the predetermined 4-bit addresses). The data at the bit-line addresses Yn–7 and Yn–6 are not required by the external address. Hence, as indicated in the data DATA of FIG. 10, the outputted data is the data Dj, n–5 and Dj, n–4 at the bit-line addresses Yn–5 and Yn–4 on the word-line address Xj.

In succession, as indicated in the sensing SNS of FIG. 10, the Y-decoder 14 prefetches 4-bit data at the bit-line addresses Yn–3 to Yn. Then, as indicated in the data DATA of FIG. 10, the outputted data is the data Dj, n–3 to Dj, n at the bit-line addresses Yn–3 to Yn on the word-line address Xj.

Further, the Y-decoder 14 prefetches 4-bit data at the bit-line addresses Yn+1 to Yn+4 of the auxiliary cell array 22 as indicated in the sensing SNS of FIG. 10. Since the data at the bit-line addresses Yn+3 and Yn+4 are not treated by the 8-bit burst read, as indicated in the data DATA of FIG. 10, the data Dj, n+1 and Dj, n+2 at the bit-line addresses Yn+1 and Yn+2 on the word-line address Xj are outputted to the outside. The data Dj, n–5 to Dn, n+2 are held in the data register so that the data Dj, n–5 to Dj, n+2 may be repetitively outputted so long as the burst read is continued.

As indicated by arrows of FIG. 9, the data at the bit-line addresses Y0 and Y1 on the word-line address Xk are stored at the bit-line addresses Yn+1 and Yn+2 of the auxiliary cell array 22. Hence, the data at the bit-line addresses Y0 and Y1 on the word-line address Xk are allowed to be read out of the bit-line addresses Yn+1 and Yn+2 of the auxiliary cell array 22 and to be continuously outputted at fast speed without having to switch the word line from the word-line address Xj to the address Xk.

Moreover, in the prior art, the range of the burst read is limited to the same word line. The second embodiment makes it possible to perform the burst read of the data located over two or more word lines.

Though the Y-decoder 14 performs the 8-bit burst read through the effect of the 4-bit prefetch, the burst read may be performed with no prefetch.

Further, in a case that the burst read of the address driver 15 is performed in the range of the first bit-line address Y0 on the word-line address Xk to the last bit-line address Yn of the previous word-line address Xj in the memory cell array 21, the data may be read out of the auxiliary cell array 22. Concretely, in a case that the first bit-line address of the data pieces to be read at a time is in the range of the first bit-line address Y0 of the memory cell array 21 to the bit-line address located apart by less than the number of data pieces to be read at a time, the data is read out of the auxiliary cells at the previous word-line address Xj to the word-line address Xk. Then, the subsequent data is read out of the memory cell array 21. That is, even in the case of reading data with decrease of the bit-line addresses, the data stored in the memory cells are allowed to be read out so that the data may be constantly outputted at fast speed without switching the word line.

Figure 11:
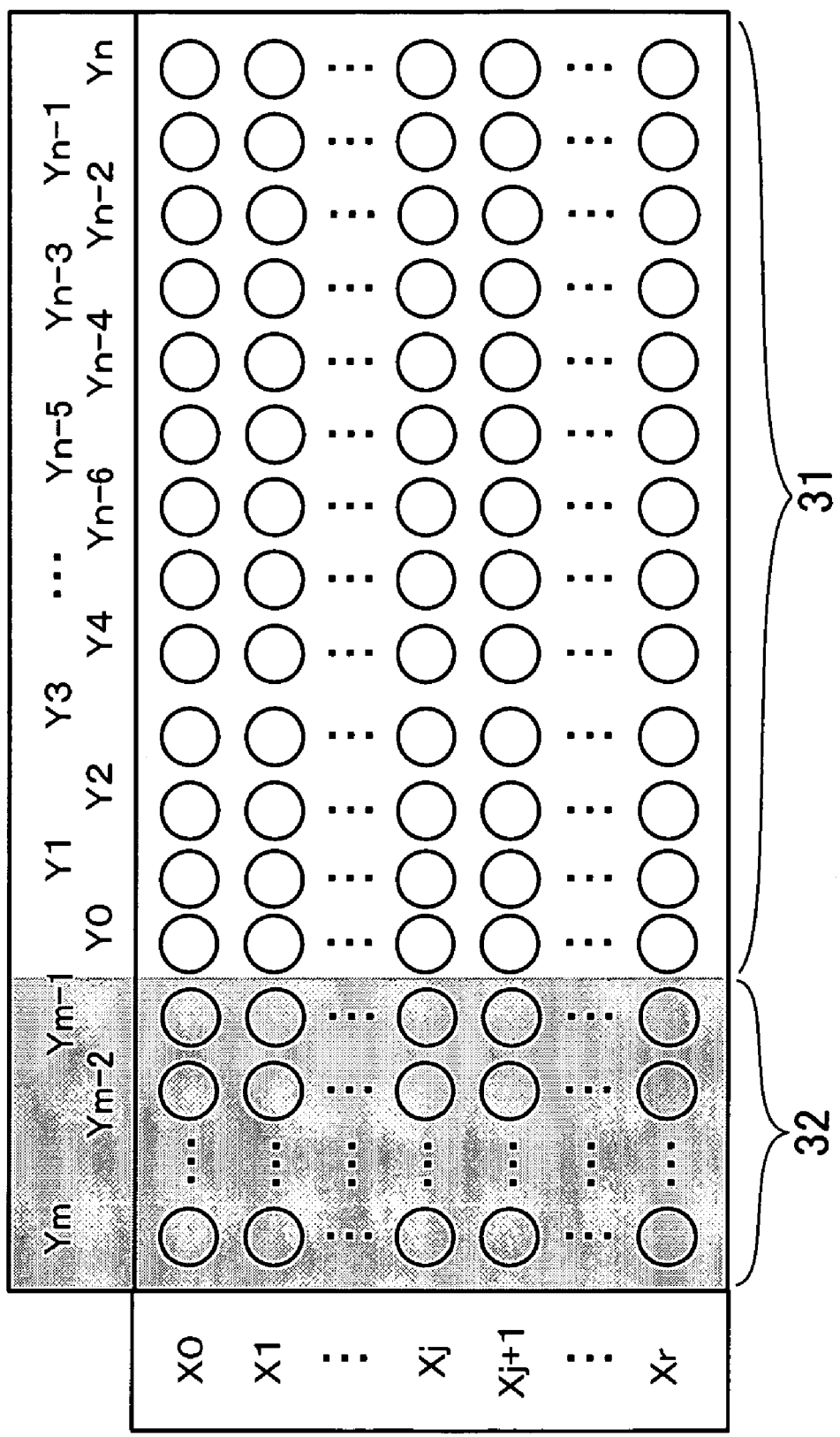
FIG. 11 is a view showing provision of an auxiliary cell array on the decreasing side of bit-line addresses of the memory cell array.
Figure 12:
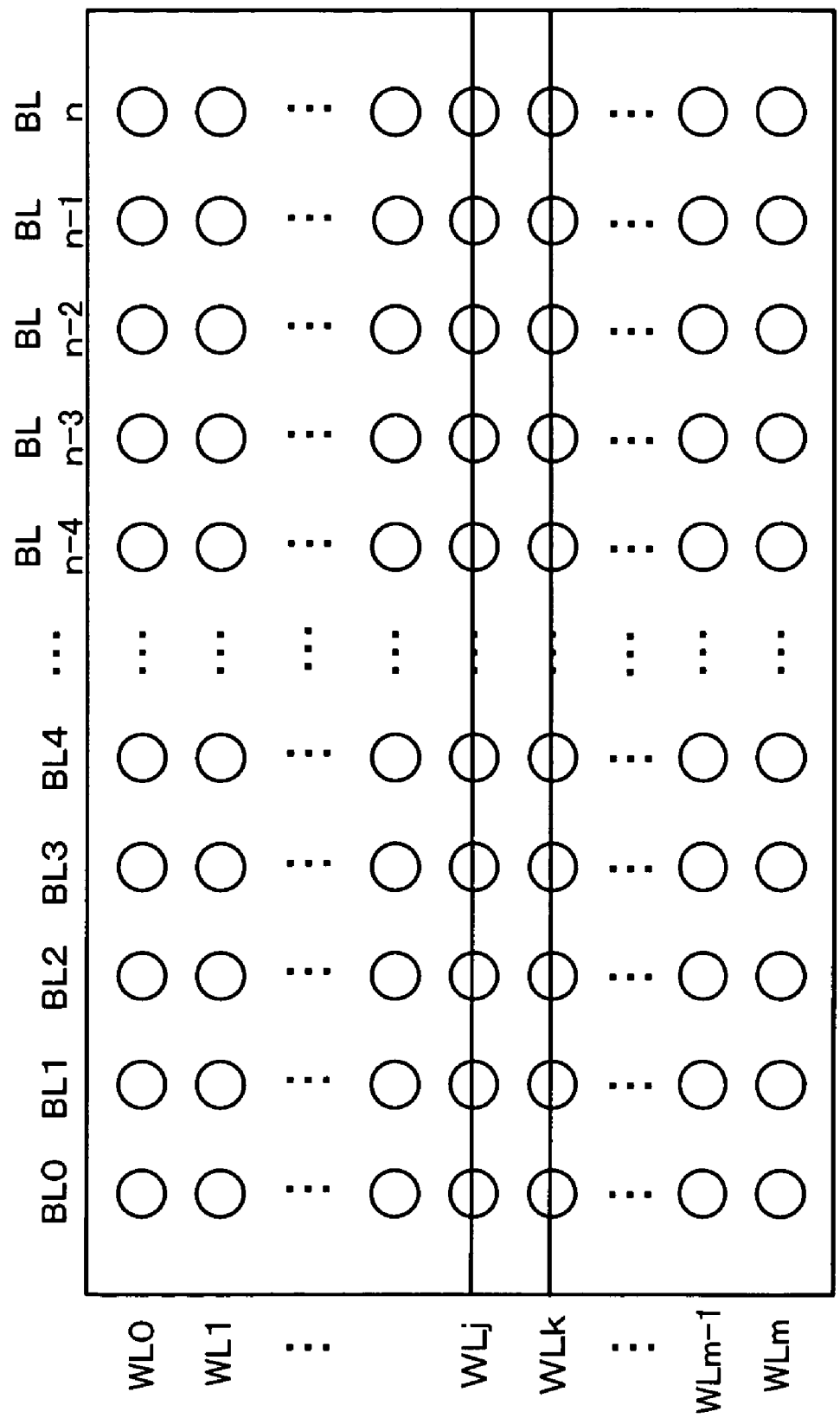
FIG. 12 is a view showing a schematic arrangement of a conventional memory cell array.
Figure 13:
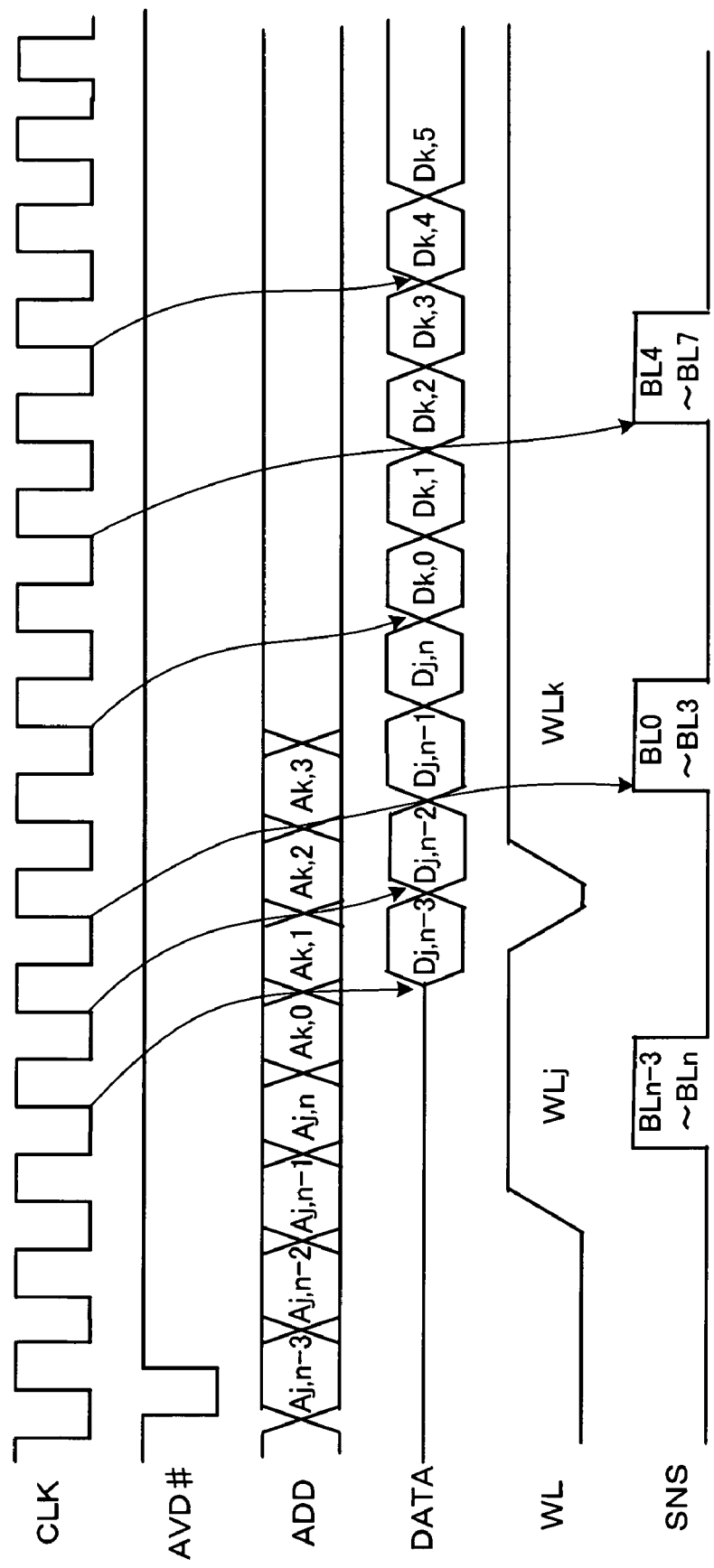
FIG. 13 is a timing chart showing the timing on which the data is read from the memory cell array shown in FIG. 12 through the effect of the 4-bit prefetch.
Figure 14:
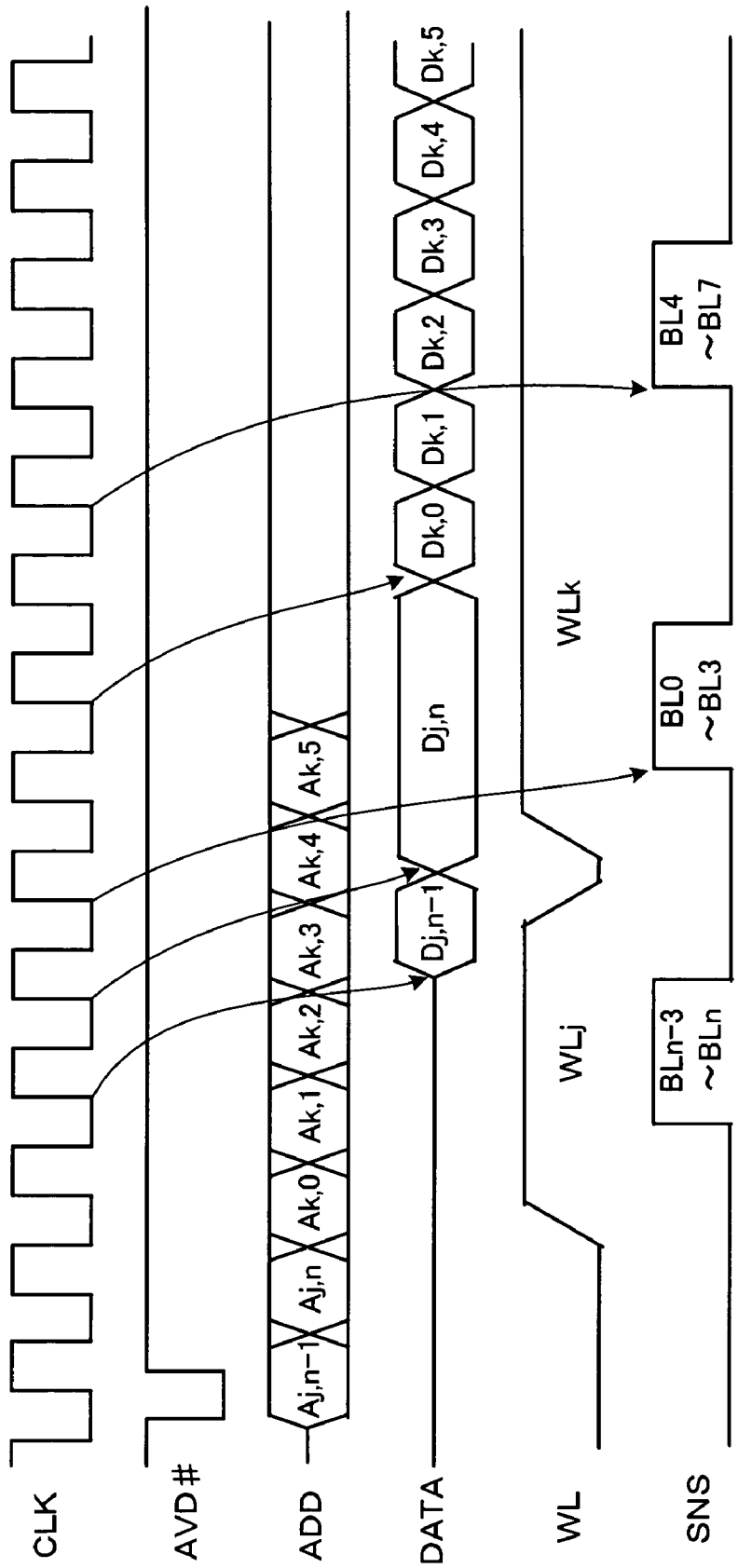
FIG. 14 is a timing chart for explaining the timing on which no gapless read is realized.

In the first and the second embodiments, the auxiliary cell arrays 12 and 22 are provided on the increasing side of the bit-line addresses of the memory cell arrays 11 and 21. In actual, however, they may be provided on the decreasing side thereof. FIG. 11 illustrates the auxiliary cell array provided on the decreasing side of the bit-line addresses of the memory cell array. A circle shown in FIG. 11 denotes each of a memory cell array 31 or an auxiliary cell array 32. Each memory cell is connected with a word line and a bit line though these lines are not shown. X0, X1, . . . , Xj, Xk, . . . Xr (j, k and r are a positive integer wherein k=j+1) denote word-line addresses of memory cells, respectively. Ym, . . . , Ym–2, Ym–1, Y0, Y1, . . . , Yn–1, Yn (n and m are a positive integer) denote bit-line addresses of memory cells, respectively.

As shown in FIG. 11, the auxiliary cell array 32 is concatenated with the first bit-line address Y0 on the decreasing side of the bit-line addresses of the memory cell array 31. The auxiliary cell array 32 stores data at the last bit-line address on the previous word-line address to the bit-line address located apart by a predetermined number of bits in the memory cell array 31.

In a case that the data pieces to be read at a time range from the first bit-line address Y0 of the memory cell array 31 to the bit-line address Yn on the previous word-line address thereof, the address driver 15 shown in FIG. 2 reads the relevant data from the auxiliary cell array 32. Concretely, in a case that the first bit-line address of the data pieces to be read at a time is in the range of the first bit-line address Y0 of the memory cell array 31 to the bit-line address located apart by the smaller number than or equal number to the number of the data pieces to be read at a time, the address driver 15 reads the relevant data out of the auxiliary cell array 32 of the concerned word-line address. Then, the following data is read out of the previous word-line addresses of the memory cell array 31.

In a case that the data pieces to be read at a time range from the last bit-line address Yn of the memory cell array 31 to the first bit-line address Y0 on the next word-line address, the address driver 15 reads the relevant data out of the auxiliary cell array 32. Concretely, in a case that the first bit-line address of the data pieces to be read at a time is in the range from the last bit-line address Yn to the bit-line address located apart by the smaller number than or equal number to the number of data pieces to be read at a time, the address driver 15 reads the relevant data out of the auxiliary cell array 32 of the next word-line address. Then, the following data are read out of the memory cell array 31 of the concerned word-line address.

As has been described with respect to the first and the second embodiments, the auxiliary cell array 32 is required to have more memory cells than the number of data pieces to be prefetched or equal memory cells to the number thereof if data is prefetched. If the burst read is executed, the auxiliary cell array 32 is required to have more memory cells than the number derived by subtracting 1 from the number of cells to be burst-read or equal cells to the number. Moreover, the change of an external address or the input of a read/write signal from the outside causes a series of bit-line addresses to be generated.

As described above, in a case that the auxiliary cell array is concatenated with the word lines on the decreasing side of the bit-line addresses of the memory cell array, the data may be read out of the memory cells without switching the word line, which makes it possible to constantly output data at fast speed.

Further, in a case that the semiconductor memory device is composed of nonvolatile memories such as a ROM (concretely, the memory cell arrays 11, 21 and the auxiliary cell arrays 12, 22 are composed of nonvolatile memory cells), unlike the volatile semiconductor memory, no data difference takes place between the memory cell array and the auxiliary cell array when data is read or written. In some cases, no data difference therebetween takes an advantage. That is, it is more advantageous in a memory such as an EEPROM or a flash memory that is programmed to some degree for continuously reading data, concretely, in a memory wherein the programming time is relatively longer than the read time and data is written on a plurality of memory areas at a batch (for example, erasing data at a sector unit or programming at a byte unit).

As set forth above, the present invention is arranged so that the auxiliary cell array is concatenated with the word lines on the increasing side of the bit-line addresses in the memory cell array so that the auxiliary cell array may store the same data as the data stored in the memory cells at the first bit-line address on the next word-line address to the bit-line address located apart by a predetermined number of bits. In a case that the data pieces to be read at a time ranges from the last bit-line address of the memory cell array to the first bit-line address on the next word-line address or from the first bit-line address on the next word-line address to the last bit-line address of the previous word-line address in the memory cell array, the data is caused to be read out of the auxiliary cell array. This operation allows the data to be read out without switching the word line, resulting in being able to constantly output data at fast time.

Moreover, the auxiliary cell array is concatenated with the word lines on the increasing side of the bit-line addresses. This provision makes the circuit area smaller.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device for reading and outputting a plurality of stored data pieces at a time, comprising:
    an auxiliary cell array concatenated with word lines of a memory cell array on the increasing side of bit lines of said memory cell array and for storing data at a first bit-line address on a next word-line address to a bit-line address located within a predetermined range of bits from said first bit-line address in said memory cell array; and
    an address driver for reading data out of said auxiliary cell array if said data pieces to be read at a time ranges from a last bit-line address of said memory cell array to a first bit-line address on the next word-line address therein or from a first bit-line address on the next word-line address to a last bit-line address on the previous word-line address in said memory cell array.

2. The semiconductor memory device according to claim 1, wherein said address drive includes:
    a determining circuit for determining whether or not a first bit-line address of said data pieces to be read at a time is in the range of a last bit-line address to a bit-line address located apart by a smaller number than or equal number to the number of data pieces to be read at a time; and
    a reading circuit for reading said data pieces out of said auxiliary cell array following said last bit-line address if the first bit-line address of said data pieces to be read at a time is located apart by a smaller number than or equal number to the number of said data pieces.

3. The semiconductor memory device according to claim 1, wherein said address driver includes:
    a determining circuit for determining whether or not a first bit-line address of said data pieces to be read at a time ranges from a first bit-line address on said next word-line address to a bit-line address located apart by a smaller number than or equal number to the number of said data pieces to be read at a time in said memory cell array; and
    a reading circuit for reading said data pieces on said previous word-line address of said auxiliary cell array if said first bit-line address of said data pieces to be read at a time is a bit-line address located apart by a smaller number than or equal number to the number of said data pieces.

4. The semiconductor memory device according to claim 1, wherein the number of cells on said word line included in said auxiliary cell array is greater than or equal to the number of said data pieces to be read at a time.

5. The semiconductor memory device according to claim 1, wherein the read of said data pieces at a time is executed through the effect of a prefetch.

6. The semiconductor memory device according to claim 5, wherein the number of cells on said word line included in said auxiliary cell array is greater than or equal to the number of data pieces to be prefetched.

7. The semiconductor memory device according to claim 5, wherein the read of said data pieces at a time is executed through the effect of a burst read.

8. The semiconductor memory device according to claim 7, wherein the number of cells on said word line included in said auxiliary cell array is more than or equal to the number derived by subtracting 1 from the number of data pieces to be burst-read.

9. The semiconductor memory device according to claim 7, wherein the number of cells on said word line included in said auxiliary cell array is more than or equal to the number derived by subtracting 1 from a maximum number of data pieces to be burst-read if the number of data pieces to be burst-read may be selected from a plurality of predetermined numbers.

10. The semiconductor memory device according to claim 1, wherein said address driver includes an address counter for generating a series of bit-line addresses from an external address specified from the outside.

11. The semiconductor memory device according to claim 10, wherein said series of bit-line addresses are generated when said external address is changed.

12. The semiconductor memory device according to claim 10, wherein said series of bit-line addresses are generated when a read/write signal is inputted from the outside.

13. The semiconductor memory device according to claim 1, wherein said memory cell array and said auxiliary cell array are both composed of nonvolatile memories.

14. A semiconductor memory device for reading and outputting a plurality of stored data pieces at a time, comprising:
an auxiliary cell array concatenated with word lines in a memory cell array on the decreasing side of bit-line addresses and for storing data from a last bit-line address on a previous word-line address to a bit-line address located apart by a predetermined number of bits in said memory cell array; and
an address driver for reading said data pieces out of said auxiliary cell array if said data pieces to be read at a time ranges from a first bit-line address of said memory cell array to a last bit-line address on a previous word-line address therein or from a last bit-line address to a first bit-line address on a next word-line address in said memory cell array.

15. The semiconductor memory device according to claim 14, wherein said address driver includes:
a determining circuit for determining whether or not a first bit-line address of said data pieces to be read at a time is in the range from a first bit-line address on the next word-line address to a bit-line address located apart by a smaller number than or equal number to the number of said data pieces to be read at a time in said memory cell array; and
a reading circuit for reading said data pieces out of said auxiliary cell array following the first bit-line address of said next word-line address when the first bit-line address of said data pieces to be read at a time is a bit-line address located apart by a smaller number than or equal number to the number of said data pieces.

16. The semiconductor memory device according to claim 14, wherein said address driver includes:
a determining circuit for determining whether or not a first bit-line address of said data pieces to be read at a time ranges from a last bit-line address to a bit-line address located apart by a smaller number or equal number to the number of said data pieces to be read at a time;
a reading circuit for reading said data pieces on said next word-line address of said auxiliary cell array if the first bit-line address of said data pieces to be read at a time is a bit-line address located apart by a smaller number than or equal number to the number of said data pieces.

17. The semiconductor memory device according to claim 14, wherein the number of cells on said word line included in said auxiliary cell array is more than or equal to the number of said data pieces to be read at a time.

18. The semiconductor memory device according to claim 14, wherein the read of said data pieces at a time is executed through the effect of a prefetch.

19. The semiconductor memory device according to claim 18, wherein the number of cells on said word line included in said auxiliary cell array is more than or equal to the number of said data pieces to be prefetched.

20. The semiconductor memory device according to claim 14, wherein the read of data pieces at a time is executed through the effect of a burst read.

21. The semiconductor memory device according to claim 20, wherein the number of cells on said word line included in said auxiliary cell array is more than or equal to the number derived by subtracting 1 from the number of said data pieces to be burst-read.

22. The semiconductor memory device according to claim 20, wherein the number of cells on said word line included in said auxiliary cell array is more than or equal to the number derived by subtracting 1 from a maximum number of said data pieces to be burst-read if the number of said data pieces to be burst-read may be selected from a plurality of predetermined values.

23. The semiconductor memory device according to claim 14, wherein said address driver includes an address counter for generating a series of bit-line addresses from an external address specified from the outside.

24. The semiconductor memory device according to claim 23, wherein said series of bit-line addresses are generated when said external address is changed.

25. The semiconductor memory device according to claim 23, wherein said series of bit-line addresses are generated when a read/write signal is inputted from the outside.

26. The semiconductor memory device as claimed in claim 14, wherein said memory cell array and said auxiliary cell array are both composed of nonvolatile memories.

27. A method of reading data from a semiconductor memory device for reading and outputting stored data pieces at a time, comprising the step of:
reading said data pieces from an auxiliary cell array concatenated with word lines on the increasing side of bit-line addresses in a memory cell array and for storing data at a first bit-line address on a next word-line address to a bit-line address located apart by a predetermined number of bits in said memory cell array if the read of said data pieces at a time ranges from a last bit-line address to a first bit-line address on a next word-line address in said memory cell array.

28. The method according to claim 27, wherein the process of reading said data from said auxiliary cells includes the steps of:
determining whether or not a first bit-line address of said data pieces to be read at a time is in the range from a last bit-line address to a bit-line address located apart by a smaller number than or equal to the number of said data pieces to be read at a time in said memory cell array; and
reading said data pieces from said auxiliary cell following said last bit-line address if the first bit-line address of said data pieces to be read at a time is a bit-line address located apart by a smaller number than or equal number to the number of said data pieces.

29. A method of reading data from a semiconductor memory device for reading and outputting stored data pieces at a time, comprising the step of:
reading said data from an auxiliary cell array concatenated with word lines on the increasing side of bit-line addresses in said memory cell array and for storing data at a first bit-line address on a next word-line address to a bit-line address located apart by a predetermined number of bits in said memory cell array if the read of said data pieces at a time ranges from the first bit-line address on the next word-line address to the last bit-line address on the previous word-line address in said memory cell array.

30. The method according to claim 29, wherein the process of reading said from said auxiliary cells, comprising the steps of:

determining whether or not the first bit-line address of said data pieces to be read at a time is a bit-line address located apart by a smaller number than or equal number to the number of said data pieces to be read at a time; and reading said data from said previous word-line address in said auxiliary cell array if the first bit-line address of said data pieces to be read at a time is a bit-line address located apart by a smaller number than or equal number to the number of said data pieces.

31. A method of reading data from a semiconductor memory device for reading and outputting stored data pieces at a time, comprising the step of:

reading said data from an auxiliary cell array concatenated with word lines on the decreasing side of bit-line addresses of said memory cell array and for storing data at a last bit-line address on a previous word-line address to a bit-line address located apart by a predetermined number of bits if the read of said data pieces at a time ranges from a first bit-line address on a next word-line address to a last bit-line address on the pervious word-line address in said memory cell array.

32. The method according to claim 31, wherein the process of reading said data from said auxiliary cells, comprising the steps of:

determining whether or not the first bit-line address of said data pieces to be read at a time is in the range from a first bit-line address on said next word-line address to a bit-line address located by a smaller number or equal number to the number of said data pieces in said memory cell array; and reading said data from said auxiliary cells following the first bit-line address on said next word-line address if the first bit-line address of said data pieces to be read at a time is a bit-line address located apart by a smaller number than or equal number to the number of said data pieces.

33. A method of reading data from a semiconductor memory device for reading and outputting stored data pieces at a time, comprising the step of:

reading said data from an auxiliary cell array concatenated with word lines on the decreasing side of bit-line addresses in a memory cell array and for storing data at a last bit-line address on a previous word-line address to a bit-line address located apart by a predetermined number of bits in said memory cell array if the read of said data pieces at a time ranges from a last bit-line address to a first bit-line address on a next word-line address in said memory cell array.

34. The method according to claim 33, wherein the process of reading said data from said auxiliary cells, comprising the steps of:

determining whether or not a first bit-line address of said data pieces to be read at a time ranges from a last bit-line address to a bit-line address located apart by a smaller number than or equal number to the number of data pieces to be read at a time in said memory cell array; and reading said data from said next word-line address in said auxiliary cell array if the first bit-line address of said data pieces to be read at a time is a bit-line address located apart by a smaller number than or equal number to the number of said data pieces.

* * * * *